United States Patent
Ho

(10) Patent No.: US 8,421,953 B2
(45) Date of Patent: Apr. 16, 2013

(54) BACKLIGHT UNIT AND LIQUID CRYSTAL DISPLAY DEVICE HAVING THE SAME

(75) Inventor: Kim Kyu Ho, Incheon (KR)

(73) Assignee: LG Display Co., Ltd., Seoul (KR)

( * ) Notice: Subject to any disclaimer, the term of this patent is extended or adjusted under 35 U.S.C. 154(b) by 377 days.

(21) Appl. No.: 12/818,836

(22) Filed: Jun. 18, 2010

(65) Prior Publication Data

US 2011/0007238 A1 Jan. 13, 2011

(30) Foreign Application Priority Data

Jun. 18, 2009 (KR) .................. 10-2009-0054608

(51) Int. Cl.
*G02F 1/1335* (2006.01)

(52) U.S. Cl.
USPC .................. 349/61; 349/62; 349/64; 349/65; 362/612

(58) Field of Classification Search .................. None
See application file for complete search history.

(56) References Cited

U.S. PATENT DOCUMENTS

| | | | |
|---|---|---|---|
| 7,646,450 B2 * | 1/2010 | Jung | 349/69 |
| 2007/0030674 A1 * | 2/2007 | Kim et al. | 362/231 |
| 2009/0122231 A1 * | 5/2009 | Aoyagi et al. | 349/65 |

\* cited by examiner

*Primary Examiner* — Thanh-Nhan P Nguyen
(74) *Attorney, Agent, or Firm* — Brinks Hofer Gilson & Lione

(57) ABSTRACT

A backlight unit with advantages of being thin and of reducing manufacturing time is disclosed.
The backlight unit includes: a plurality of LEDs driven to be divided into at least two channels; a metal PCB loaded with the plurality of LEDs and configured to include a single layer structure; and a plurality of pad portions formed on the metal PCB and defined into the channels. The plurality of pad portions is separated by different distances from top/bottom edge lines of the metal PCB according to the channels.

12 Claims, 3 Drawing Sheets

BACKLIGHT UNIT AND LIQUID CRYSTAL DISPLAY DEVICE HAVING THE SAME

CROSS-REFERENCE TO RELATED APPLICATION

This application claims priority under 35 U.S.C. 119 to Korean Patent Application No. 10-2009-0054608, filed on Jun. 18, 2009, which is hereby incorporated by reference in its entirety.

BACKGROUND

1. Field of the Disclosure

This disclosure relates to a backlight unit, and more particularly to a backlight unit with advantages of being thin and of reducing manufacturing time, and a liquid crystal display (LCD) device with the same.

2. Description of the Related Art

Cathode ray tubes (CRTs) correspond to one of display devices which are widely used. The CRTs are mainly used as monitors for TVs, measuring apparatuses, or information terminals. However, the heavy weight and large size of the CRTs have been a major hindrance to the manufacturing of small, light electronic products.

In other words, the CRTs have the limitations of weight and size in the current trend of small, light electronic products. Under such circumstances, LCD devices using an electro-optical effect, plasma display panels (PDPs) using a gas discharge, electro luminescence display devices using a electro-luminescent effect, and so on are expected to substitute for CRTs.

Among the substitutable display devices, LCD devices are being actively researched. Also, LCD devices are gradually being used in a wide range of applications due to their advantages such as lightness, thinness, and low power consumption. Moreover, LCD devices are being manufactured to have even larger screens, be thinner, and consume less power, in order to meet the requirements of users. Such LCD devices display images by controlling the amount of light transmitted through liquid crystal.

The LCD devices are not self-illuminating display devices, unlike CRTs. As such, an LCD device includes a backlight unit provided on the rear surface of an LCD panel. The backlight unit includes a separated light source providing the light necessary to display an image. The backlight unit can be classified as either an edge type or a direct type in accordance with the disposition of a light source.

Such an edge type backlight unit is mainly applied to comparatively small-sized LCD devices such as the monitors of laptops and desk-top computers. The edge type backlight unit has good light uniformity, a lengthened lifespan, and the advantage of thinning the LCD device.

The direct type backlight unit has begun to be concentrically developed as the LCD device is enlarged to a size above 20 inches. The direct type backlight unit forces light to be directly irradiated onto the entire surface of the LCD panel. To this end, the direct type backlight unit includes a plurality of light sources arranged on the lower surface of a diffusion plate. Since the direct type backlight unit has a higher light efficiency than the edge type backlight unit, it is mainly used for LCD devices of a large size which require a high brightness.

The backlight unit employs a plasma type light source, such as a cold cathode fluorescent lamp (CCFL), a hot cathode fluorescent lamp (HCFL), an external electrode fluorescent lamp (EEFL), an external and internal electrode fluorescent lamp (EIFL), or others, as a light source. Alternatively, the backlight unit uses a white light emission diode (LED) as a light source. Particularly, the white LED is widely used in the backlight unit because of its features of long lifespan, low power consumption, small size, durability, and others.

The edge type backlight unit with the LEDs is configured to include a printed circuit board (PCB) disposed at an inner side surface of a box-shaped bottom cover with an opened upper surface. The LEDs are arranged at fixed intervals on the PCB. More specifically, the LEDs are loaded on respective pad portions, respectively. The pad portions loaded with the LEDs are arranged on the PCB in such a manner as to form one row line.

Such a PCB included in the related art backlight unit is configured to include wirings which transfer driving signals to electrodes of the LEDs. The wirings are formed along a longitude direction of the PCB. As such, the PCB is necessary to have regions, which each have an enough width for the formation of the wirings, adjacent to the top and bottom edges of the row of pads.

Moreover, the LEDs can be driven in such a manner as to be divided into a plurality of channels. In this case, the wirings become more complex, and furthermore the width of the PCB being an important factor in the thickness of the backlight unit becomes larger. Therefore, it is difficult to manufacture a thinner backlight unit.

The PCB included in the related art backlight unit can be formed to have at least two layers, in order to arrange the row of pad portions and the wirings on different layers. As such, the width of the PCB can be reduced. However, at least one manufacturing process is added, manufacturing costs largely increase, and heat radiating effect is deteriorated.

SUMMARY

A backlight unit includes a plurality of LEDs driven to be divided into at least two channels; a metal PCB loaded with the plurality of LEDs and configured to include a single layer structure; and a plurality of pad portions formed on the metal PCB and defined into the channels. The plurality of pad portions is separated by different distances from top/bottom edge lines of the metal PCB according to the channels.

An LCD device according to one general aspect of the present embodiment includes: an LCD panel; a plurality of LEDs driven to be divided into at least two channels and configured to apply light to the LCD panel; a metal PCB loaded with the plurality of LEDs and configured to include a single layer structure; and a plurality of pad portions formed on the metal PCB and defined into the channels. The plurality of pad portions is separated by different distances from top/bottom edge lines of the metal PCB according to the channels.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
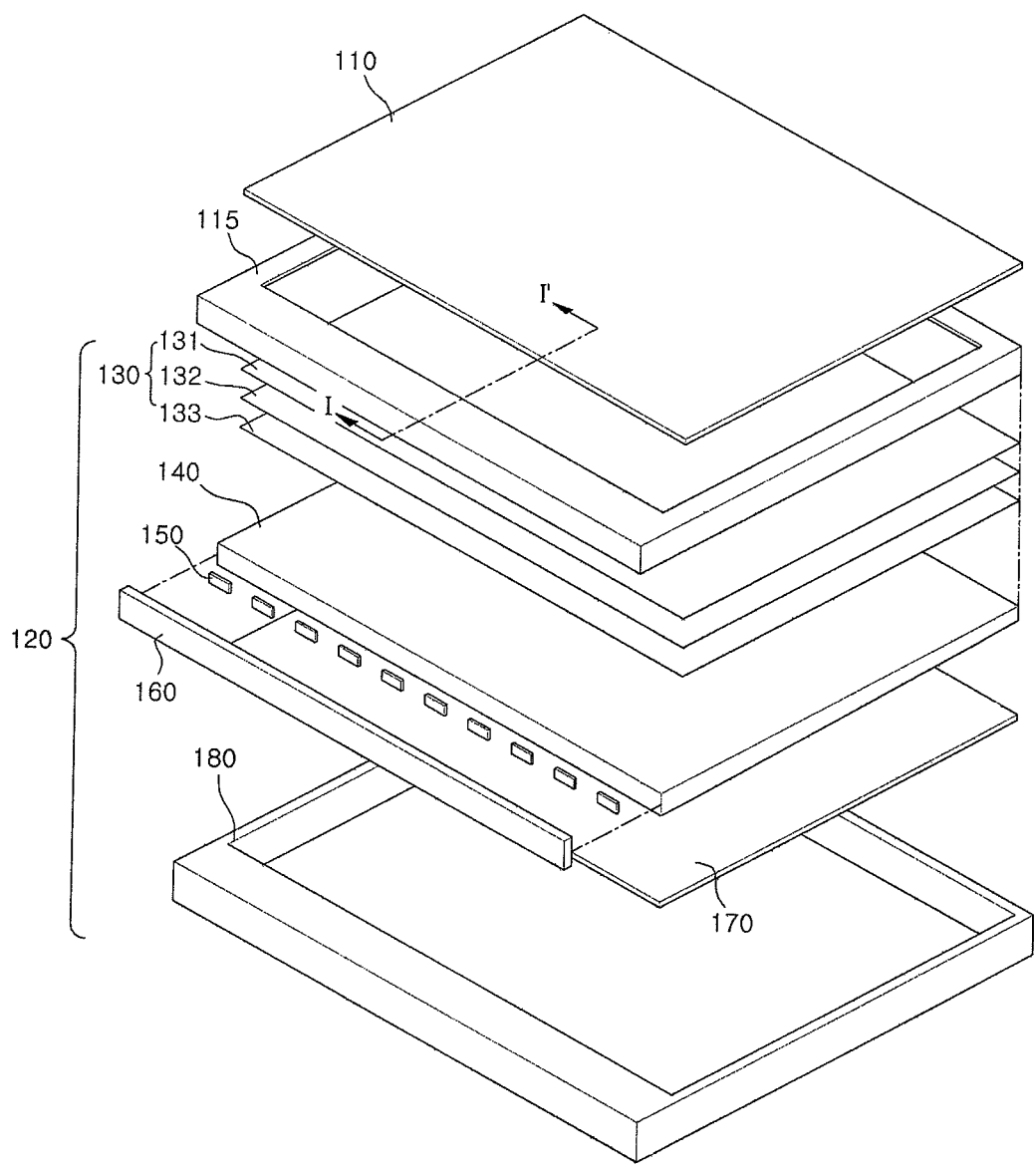
FIG. 1 is a disassembled perspective view showing an LCD device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
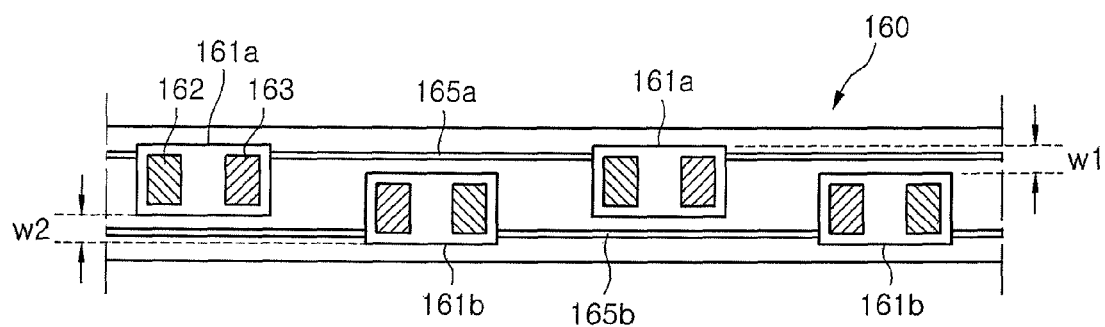
FIG. 2 is a planar view showing a configuration of the metal PCB in FIG. 1.
Figure 3:
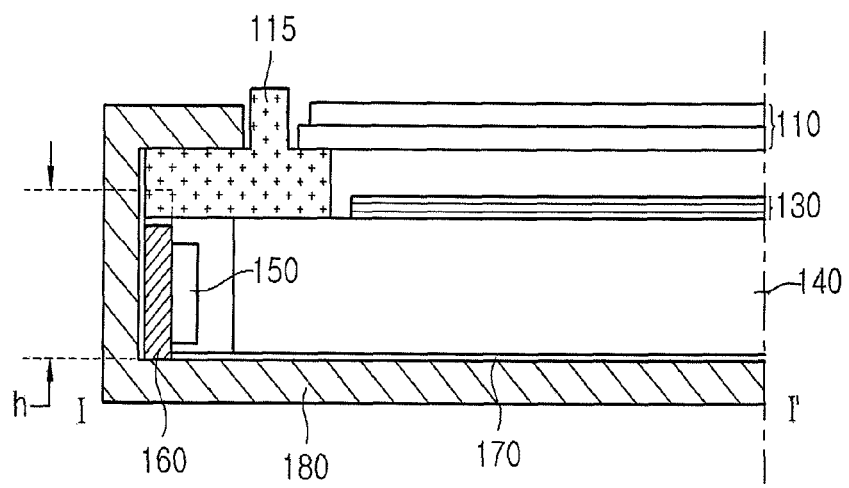
FIG. 3 is a cross-sectional view showing the LCD device taken along a line I-I' in FIG. 1.

FIG. 1 is a disassembled perspective view showing an LCD device according to an embodiment of the present disclosure. FIG. 2 is a planar view showing the configuration of a metal PCB according to an embodiment of the present disclosure. FIG. 3 is a cross-sectional view showing the LCD device taken along a line I-I' in FIG. 1;

Referring to FIGS. 1 through 3, an LCD device according to an embodiment of the present disclosure includes an LCD panel 110 configured to display images, support main 115 configured to support edges of the LCD panel 110, and a backlight unit 120 disposed on the rear surface of the LCD panel 110. The backlight unit 120 is configured to apply light to the rear surface of the LCD panel 110.

The LCD panel 110 includes a thin film transistor substrate and a color filter substrate disposed opposite each other and combined to maintain a uniform cell gap between them, as well as a liquid crystal layer (not shown) interposed between the two substrates. Although they are not shown in detail in the drawings, the color filter substrate and the thin film transistor substrate will now be described. The thin film transistor substrate includes a plurality of gate lines and a plurality of data lines formed to cross each other, and a plurality of thin film transistors formed at the intersections of the plurality of gate lines and the plurality of data lines. The plurality of gate lines and the plurality of data lines crossing each other define the pixels. The thin film transistors are connected to pixel electrodes each included in the pixels, respectively. On the other hand, the color filter substrate includes: red, green, and blue color filters opposite to the pixels; a black matrix rimmed each of the color filters; and a common electrode formed to cover the color filters and the black matrix. The black matrix shields the gate lines, the data lines, and the thin film transistors.

The LCD device further includes a gate driver (not shown) and a data driver disposed by the sides of the LCD panel 110. The gate driver is connected to the gate lines, in order to sequentially apply a scan signal to the gate lines on the LCD panel 110. The data driver is connected to the data lines, in order to apply data signals to the data lines on the LCD panel 110. Such gate and data drivers are electrically connected to the LCD panel 110 by means of tabs which are configured in a tape carrier package (TCP).

In this manner, the scan and data signals are applied from the gate and data drivers, which are electrically connected with the LCD panel 110, to the plurality of gate lines and the plurality of data lines on the LCD panel 110. Therefore, the pixels on the LCD panel 110 are driven.

The backlight unit 120 disposed under the LCD panel 110 includes a box-shaped bottom cover 180 with an opened upper surface, a metal PCB 160 disposed at an inner side of the bottom cover 180, and a plurality of LEDs 150 loaded on the metal PCB 160. The backlight unit 120 further includes a light guide plate 140 disposed parallel to the plurality of LEDs 150, a reflection sheet 170 disposed under the light guide plate 140, and optical sheets 130 disposed over the light guide plate 140. The light guide plate 140 is configured to convert spotted incident lights into two-dimensional light. The reflection sheet 170 reflects lights progressing downward from the light guide plate 140 toward the LCD panel 110. The optical sheets 130 scatter and converge light entering from the light guide plate 140. Such optical sheets 130 include a diffusion sheet 133 configured to scatter light, a convergent sheet 132 configured to converge the scattered light, and a protective sheet 131 configured to protect convergent patterns which are formed on the convergent sheet 132.

The plurality of LEDs 150 can be configured to include only LEDs each emitting white light. Alternatively, the plurality of LEDs 150 can be configured to include either a combination of LEDs emitting red, green, and blue lights, or another combination of LEDs emitting white, red, green, and blue lights.

In order to improve the driving stability, the plurality of LEDs 150 is driven in at least two channel modes. For example, the plurality of LEDs 150 is driven in such a manner as to be divided into first and second channels. In this case, the first and second channels are connected parallel to each other. The LEDs 150 assigned to the first channel are connected to one another, and the rest of the LEDs 150 assigned to the second channel are connected with one another. As such, a driving signal enlarged enough to sufficiently drive all the LEDs 150 can be applied. In this way, as the channels increase, a more stable driving state of the LEDs 150 can be provided.

The metal PCB 160 is configured to include first pad portions 161a each loaded with the respective LEDs 150 which are connected to the first channel, and second pad portions 161b each loaded with the respective LEDs 150 which are connected to the second channel. The first pad portions 161a are formed on the metal PCB 160 in such a manner as to be separate from one another by a first fixed interval. Similarly, the second pad portions 161b are formed on the metal PCB 160 in such a manner as to be separate from one another by the first fixed interval. The metal PCB 160 is formed in a single layer.

The first pad portions 161a are arranged alternately with the second pad portions 161b. Also, the first pad portions 161a and the second pad portions 161b are arranged at different distances from a top longitude direction edge line of the metal PCB 160. In other words, the first pad portions 161a and the second pad portions 161b are arranged in a zigzag manner along the longitude direction of the metal PCB 160 and separated by a second fixed interval from each other. Consequently, the first pad portions 161a are formed in a row line on the metal PCB 160. The row line of first pad portions 161a is parallel to the longitude direction of the metal PCB 160. Similarly, the second pad portions 161b are formed in another row line on the metal PCB 160. The row line of second pad portions 161b is also parallel to the longitude direction of the metal PCB 160.

The metal PCB 160 is further configured to include a first wiring line 165a electrically connecting the first pad portions 161a to one another. The first wiring line 165a is formed in a straight line on the metal PCB 160 between the first pad portions 161a. Also, the first wiring line 165a is disposed parallel to the row line of adjacent second pad portions 161b. In other words, the first wiring line 165a is formed in a straight line on an upper wiring region w1 adjacent to the top edge of the second pad portion 161b. The upper wiring region w1 can be provided because the first pad portions 161a and the second pad portions 161b are arranged in the zigzag manner. More specifically, the upper wiring region w1 can be defined into a lengthily expanded region of the metal PCB 160 between a line formed by the top edge lines of the first pad portions 161a and another line formed by the top edge lines of the second pad portions 161b.

In this manner, the first pad portions 161a and the second pad portions 161b are separated by the different distances from the top edge line of the metal PCB 160. As such, the upper wiring region w1 enough in the formation of the first wiring line 165a electrically connecting the first pad portions 161a with one another can be secured. Therefore, the width of the metal PCB 160 can be reduced.

The metal PCB is still further configured to include a second wiring line 165b electrically connecting the second pad portions 161b to one another. The second wiring line 165b is formed in a straight line on the metal PCB 160 between the second pad portions 161b. Also, the second wiring line 165b is disposed parallel to the row line of adjacent first pad portions 161a. In other words, the second wiring line 165b is formed on a lower wiring region w2 adjacent to the bottom edge of the first pad portion 161a. The lower wiring region w2 can be provided because the first pad portions 161a and the second pad portions 161b are arranged in the zigzag manner. More specifically, the lower wiring region w2 can be defined into a lengthily expanded region of the metal PCB 160 between a line formed by the bottom edge lines of the first pad portions 161a and another line formed by the bottom edge lines of the second pad portions 161b.

Since the first pad portions 161a and the second pad portions 161b are separated by the different distances from the top edge line of the metal PCB 160, the lower wiring region w2 enough in the formation of the second wiring line 165b electrically connecting the second pad portions 161b with one another can be secured. Therefore, the width of the metal PCB 160 can be reduced.

Each of the first and second pad portions 161a and 161b is configured to include first and second electrode pads 162 and 163 formed on it. The first electrode pad 162 is connected to an anode electrode of the LED 150. The second electrode pad 163 is connected to a cathode electrode of the LED 150.

As described above, the LCD device according to an embodiment of the present disclosure allows the first pad portions 161a and the second pad portions 161b to be separated by the different distances from the top/bottom edge lines of the metal PCB 160. Therefore, the upper wiring region w1 in the formation of the first wiring line 165a electrically connecting the first pad portions 161a with one another can be secured. In addition, the lower wiring region w2 necessary for the formation of the second wiring line 165b electrically connecting the second pad portions 161b with one another can be secured. As a result, the width "h" of the metal PCB 160 can be reduced, and furthermore the LCD device can easily become thinner.

Figure 4:
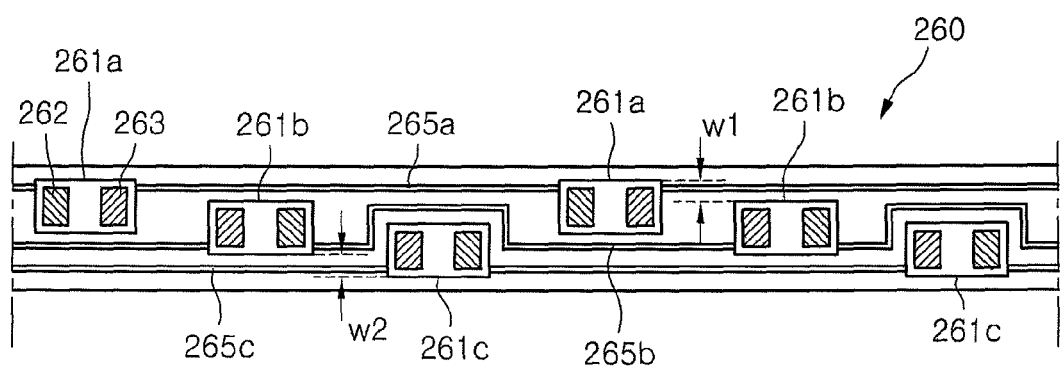
FIG. 4 is a planar view showing the configuration of a metal PCB according to another embodiment of the present disclosure.
Figure 5:
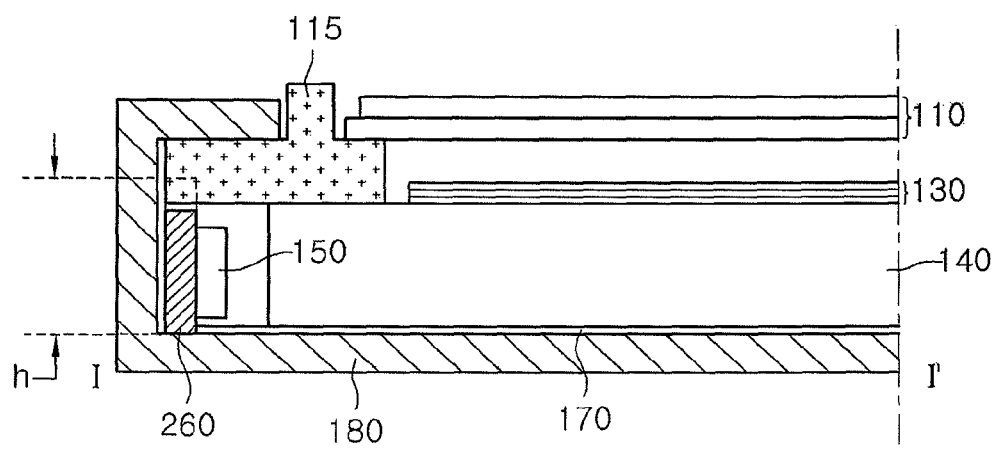
FIG. 5 is a cross-sectional view showing an LCD device according to another embodiment of the present disclosure.

FIG. 4 is a planar view showing the configuration of a metal PCB according to another embodiment of the present disclosure. FIG. 5 is a cross-sectional view showing an LCD device according to another embodiment of the present disclosure.

The LCD device of another embodiment in FIGS. 4 and 5 has the same configuration as that according to an embodiment of the present disclosure shown in FIGS. 1 and 3, with the exception of a metal PCB 260. As such, the detailed description for the rest of the LCD device of another embodiment without the metal PCB 260 will be omitted.

The plurality of LEDs 150 is driven in such a manner as to be divided into first through third channels, so as to improve the driving stability. In this case, the first through third channels are connected parallel to one another. The LEDs 150 assigned to the first channel are connected parallel to one another, the LEDs 150 assigned to the second channel are connected parallel to one another, and the rest of the LEDs 150 assigned to the third channel are connected parallel to one another. As such, a driving signal enlarged enough to sufficiently drive all the LEDs 150 can be applied. In this way, as the channels increase, a more stable driving state of the LEDs 150 can be implemented.

The metal PCB 260 is configured to include first pad portions 261a each loaded with the respective LEDs 150 which are connected to the first channel, second pad portions 261b each loaded with the respective LEDs 150 which are connected to the second channel, and third pad portions 261c each loaded with the respective LEDs 150 which are connected to the third channel. The first pad portions 261a are formed on the metal PCB 260 in such a manner as to be separate from one another by a first fixed interval. Similarly, the second pad portions 261b are formed on the metal PCB 260 in such a manner as to be separate from one another by the first fixed interval. The third pad portions 261c are also formed on the metal PCB 260 in such a manner as to be separated by the first fixed interval from one another. The metal PCB 260 is formed in a single layer.

The first through third pad portions 261a through 261c are arranged alternately with one another. Also, the first through third pad portions 261a through 261c are arranged at different distances from top edge line of the metal PCB 260. In other words, the first through third pad portions 261a through 261c are arranged in a zigzag manner along the longitude direction of the metal PCB 260 and separated by a second fixed interval from one another. Consequently, the first pad portions 261a are formed in a row line on the metal PCB 260. The row line of first pad portions 261a is parallel to the longitude direction of the metal PCB 260. Similarly, the second pad portions 261b are formed in another row line on the metal PCB 260. The row line of second pad portions 261b is parallel to the longitude direction of the metal PCB 260. The third pad portions 261c are also formed in still another line on the metal PCB 260. The row line of third pad portions 261c is parallel to the longitude direction of the metal PCB 260, too.

The metal PCB 260 is further configured to include first through third wiring lines 265a through 265c. The first wiring line 265a electrically connects the first pad portions 261a with one another. The first wiring line 265a is formed in a straight line on the metal PCB 260 between the first pad portions 261a. Also, the first wiring line 265a is disposed parallel to the row line of adjacent second pad portions 261b. In other words, the first wiring line 265a is formed on an upper wiring region w1 adjacent to the top edge of the second pad portion 261b. The upper wiring region w1 can be provided because the first through third pad portions 261*a* through 261*c* are arranged in the zigzag manner. More specifically, the upper wiring region w1 can be defined into a lengthily expanded region of the metal PCB 260 between a line formed by the top edge lines of the first pad portions 261*a* and another line formed by the top edge lines of the second pad portions 261*b*.

In this manner, the LCD device of another embodiment allows the first through third pad portions 261*a* through 261*c* to be separated by the different distances from the top edge line of the metal PCB 260. As such, the upper wiring region w1 necessary for the formation of the first wiring line 265*a* electrically connecting the first pad portions 261*a* with one another can be secured. Therefore, the width of the metal PCB 260 can be reduced.

The second wiring line 265*b* electrically connects the second pad portions 261*b* with one another. The second wiring line 265*b* is formed on the metal PCB 260 between the second pad portions. Also, the second wiring line 265*b* is formed to detour continuously the bottom edge of the first pad portion 261*a* and the top edge of the third pad portion 261*c*. In other words, the second wiring line 265*b* is formed in a zigzag line on a middle region of the metal PCB 260 which includes a first domain and a second domain. The first domain can be defined between a line formed by the top edge lines of the second pad portions 261*b* and another line formed by the top edge lines of the third pad portions 261*c*. The second domain can be defined between a line formed by the bottom edge lines of the first pad portion 261*a* and another line formed by the bottom edge lines of the second pad portions 261*b*. Therefore, the width of the metal PCB 260 can be reduced.

The third wiring line 265*c* electrically connects the third pad portions 261*c* with one another. The third wiring line 265*c* is formed on the metal PCB 260 between the third pad portions 261*c*. Also, the third wiring line 265*c* is disposed parallel to the row line of second pad portions 261*b*. In other words, the third wiring line 265*c* is formed on a lower wiring region w2 adjacent to the bottom edge of the second pad portion 261*b*. The lower wiring region w2 can be provided because the first through third pad portions 261*a* through 261*c* are arranged in the zigzag manner. More specifically, the lower wiring region w2 can be defined into a lengthily expanded region of the metal PCB 260 between a line formed by the bottom edge lines of the second pad portions 261*b* and another line formed by the bottom edge lines of the third pad portions 261*c*.

Since the first through third pad portions 261*a* through 261*c* are separated by the different distances from the top edge line of the metal PCB 260, the lower wiring region w2 necessary for the formation of the third wiring line 265*c* electrically connecting the third pad portions 261*c* with one another can be secured. Therefore, the width of the metal PCB 260 can be reduced.

Each of the first through third pad portions 261*a* through 261*c* is configured to include first and second electrode pads 262 and 263 formed on it. The first electrode pad 262 is connected to an anode electrode of the LED 150. The second electrode pad 263 is connected to a cathode electrode of the LED 150.

As described above, the LCD device according to another embodiment of the present disclosure allows the first through third pad portions 261*a* through 261*c* to be separated by the different distances from the top/bottom edge lines of the metal PCB 260. Therefore, the upper wiring region w1 necessary for the formation of the first wiring line 265*a* electrically connecting the first pad portions 261*a* with one another can be secured. In addition, the lower wiring region w2 necessary for the formation of the third wiring line 265*c* electrically connecting the third pad portions 261*c* with one another can be secured. As a result, the width "h" of the metal PCB 260 can be reduced, and furthermore the LCD device can easily become thinner.

Moreover, the width of the metal PCB with the structure of a single layer can be reduced. Therefore, the LCD device according to another embodiment of the present disclosure can prevent the increment of manufacturing costs and the deterioration of heat radiation which are caused by manufacturing the related art metal PCB with the structure of multiple layers.

The embodiments of the present disclosure are described to include the metal PCBs which is configured to enable the plurality of LEDs 150 to be driven in such a manner as to be divided into two and three channels, but it is not limited to this. In other words, the number of channels can be varied freely.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A backlight unit comprising:
   a plurality of LEDs driven to be divided into at least two channels;
   a metal PCB loaded with the plurality of LEDs and including a single layer structure; and
   a plurality of pad portions on the metal PCB and defined into the channels,
   wherein the plurality of pad portions are separated by different distances from top/bottom edge lines of the metal PCB according to the channels, and
   wherein the plurality of pad portions are separated by the different distances from the top edge line of the metal PCB, and the metal PCB includes an upper wiring region on which a wiring line is formed to connect the pad portions adjacent to the top edge line of the metal PCB with one another.

2. The backlight unit claimed as claim 1, wherein the plurality of pad portions are arranged, in a zigzag manner and in the formation of rows corresponding to the channels, on the metal PCB which is loaded with the LEDs.

3. The backlight unit claimed as claim 1, wherein the upper wiring region is provided between a line formed by top edge lines of the pad portions in a first channel adjacent to the top edge line of the metal PCB and another line formed by top edge lines of the pad portion in a second channel adjacent to the first channel.

4. The backlight unit claimed as claim 1, wherein the plurality of pad portions are separated by the different distances from the bottom edge line of the metal PCB, and the metal PCB includes a lower wiring region on which a wiring line is formed to connect the pad portions adjacent to the bottom edge line of the metal PCB with one another.

5. The backlight unit claimed as claim 4, wherein the lower wiring region is provided between a line formed by bottom edge lines of the pad portions in a second channel adjacent to the bottom edge line of the metal PCB and another line formed by bottom edge lines of the pad portion in a first channel adjacent to the second channel.

6. The backlight unit claimed as claim 1, further comprising at least two wiring lines formed to connect the plurality of pad portions according to the channels.

7. A liquid crystal display device comprising:
a liquid crystal display panel;
a plurality of LEDs driven to be divided into at least two channels and configured to apply light to the LCD panel;
a metal PCB loaded with the plurality of LEDs and including a single layer structure; and
and a plurality of pad portions on the metal PCB and defined into the channels,
wherein the plurality of pad portions is separated by different distances from top/bottom edge lines of the metal PCB according to the channels, and
wherein the plurality of pad portions are separated by the different distances from the top edge line of the metal PCB, and the metal PCB is configured to include an upper wiring region on which a wiring line is formed to connect the pad portions adjacent to the top edge line of the metal PCB with one another.

8. The liquid crystal display device claimed as claim 7, wherein the plurality of pad portions are arranged, in a zigzag manner and in the formation of rows corresponding to the channels, on the metal PCB which is loaded with the LEDs.

9. The liquid crystal display device claimed as claim 7, wherein the upper wiring region is provided between a line formed by top edge lines of the pad portions in a first channel adjacent to the top edge line of the metal PCB and another line formed by top edge lines of the pad portion in a second channel adjacent to the first channel.

10. The liquid crystal display device claimed as claim 7, wherein the plurality of pad portions are separated by the different distances from the bottom edge line of the metal PCB, and the metal PCB includes a lower wiring region on which a wiring line is formed to connect the pad portions adjacent to the bottom edge line of the metal PCB with one another.

11. The liquid crystal display device claimed as claim 10, wherein the lower wiring region is provided between a line formed by bottom edge lines of the pad portions in a second channel adjacent to the bottom edge line of the metal PCB and another line formed by bottom edge lines of the pad portion in a first channel adjacent to the second channel.

12. The liquid crystal display device claimed as claim 7, further comprising at least two wiring lines formed to connect the plurality of pad portions according to the channels.

* * * * *